United States Patent [19]

Sim

[11] Patent Number: 5,754,472
[45] Date of Patent: May 19, 1998

[54] FLASH MEMORY DEVICE HAVING A PROGRAM PATH THE SAME AS A READ PRE-CONDITION PATH

[75] Inventor: Hyun Soo Sim, Sungnam, Rep. of Korea

[73] Assignee: Hyundai Electronics Industries Co., Ltd., Kyungki-Do, Rep. of Korea

[21] Appl. No.: 774,265

[22] Filed: Dec. 27, 1996

[30]   Foreign Application Priority Data

Dec. 27, 1995 [KR] Rep. of Korea ............... 95-58455

[51] Int. Cl.[6] .................................................. G11C 7/00
[52] U.S. Cl. ........................... 365/185.17; 365/185.28; 365/185.22
[58] Field of Search ......................... 365/185.17, 185.22, 365/185.28, 185.33, 189.05

[56]   References Cited

U.S. PATENT DOCUMENTS

| 5,402,382 | 3/1995 | Miyawaki et al. | 365/218 |
| 5,465,235 | 11/1995 | Miyamoto | 365/185.22 |
| 5,557,568 | 9/1996 | Miyamoto et al. | 365/185.17 |

*Primary Examiner*—Vu A. Le
*Attorney, Agent, or Firm*—Fish & Richardson

[57]   ABSTRACT

The present invention relates to a flash memory cell device which can reduce the power consumption and improve the operation characteristic and reliability of the cell, by completing the program against the fully programmed memory cell string because the program is verified upon a word line-wide program into a NAND type flash memory cell string.

20 Claims, 4 Drawing Sheets

5,754,472

1

FLASH MEMORY DEVICE HAVING A PROGRAM PATH THE SAME AS A READ PRE-CONDITION PATH

BACKGROUND OF THE INVENTION

1. Field of the Invention

The present invention relates to a flash memory device, and more particularly to a flash memory device which can terminate the programming for a fully programmed NAND type memory cell string according to a verification results of a flash memory cell string.

2. Description of the Prior Arts

Generally, in a flash memory device programmed by injecting hot electrons, all the memory cells connected to one word line can be programmed or unprogrammed (that is, keeping an erasure state).

This programming method is called a word line-wide program. The word line-wide programming operation of a conventional NAND type flash memory cell string will be explained below by reference to FIG. 1.

Upon verifying a program of a memory cell string 4, the bit line BL of the memory cell string 4 is precharged by voltage Vcc in a pre-charge circuit 1.

Then, the verification operation is performed in a sense amplifier and write circuit 3 by a timing pulse of a read pre-condition circuit 2. The verified program data are amplified and inverted so as to terminate the program by a word line-wide bias against the fully programmed memory cell string. Therefore power consumption is enormous, and there is a shortcoming that the chip size becomes larger because the read pre-condition circuit and the sense amplifier are connected to each bit line of all the memory cell strings.

SUMMARY OF THE INVENTION

Accordingly, it is an object of the present invention to provide a flash memory cell which can terminate programming for a fully programmed NAND type memory cell string according to verification results of a flash memory cell string. The programming of a fully programmed memory cell string based on word line-wide program confirmation results of a NAND type flash memory cell string.

To achieve this object, the flash memory device according to the present invention comprises a Y-decoder for switching a supply of the data input through data bus lines in response to an address signal, a first switching means for supplying the data input through the Y-decoder to bit lines of a memory cell string in response to a program enable signal, a second switching means for switching a voltage supply from the voltage switching circuit in response to a read pre-condition enable signal, a fifth switching means for switching a supply of a power supply voltage and a ground voltage in response to the read pre-condition enable signal and the read enable signal, a third switching means for switching a supply of the power supply voltage and the ground voltage passed through the fifth switching means in response to a bit line voltage of the memory cell string, a fourth switching means for switching a supply of the power supply voltage in response to a pre-charge enable signal, and a latch circuit having a first and second nodes and latching voltages inverted from each other to the each node in response to operations of the first, second, third, fourth and fifth switching means. According to the present invention, a program verification operation and a read pre-condition operation can be made possible only by one circuit. Also, the present invention can reduce power consumption and improve the operational characteristic by inverting the data latched at the latch circuit against the fully programmed memory cell string as a result of the program verification.

BRIEF DESCRIPTION OF THE DRAWINGS

Other objects and advantages of the present invention will be understood by reading the detailed explanation of the embodiment with reference to the accompanying drawings in which.

DESCRIPTION OF THE INVENTION

Below, the present invention will be described in detail by reference to the accompanying drawings.

Figure 1:
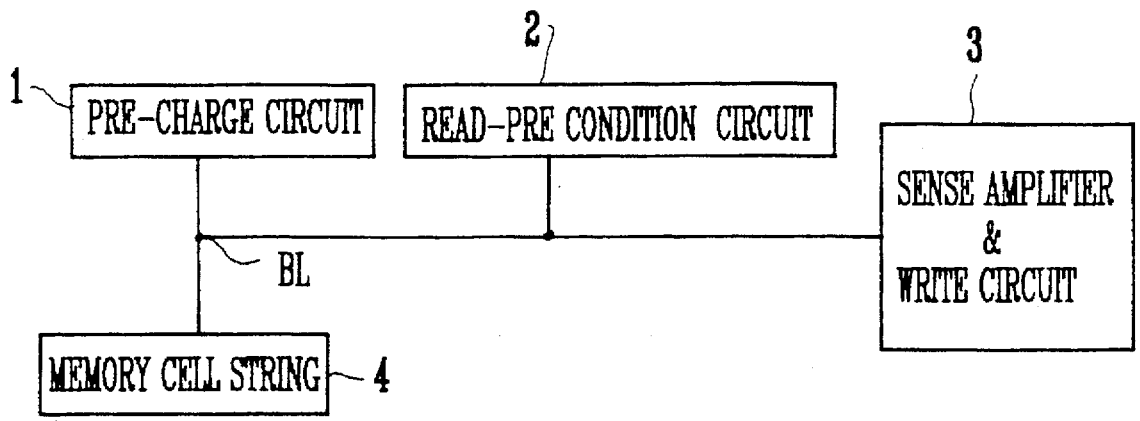
FIG. 1 is a block diagram for illustrating a conventional flash memory device.
Figure 3:
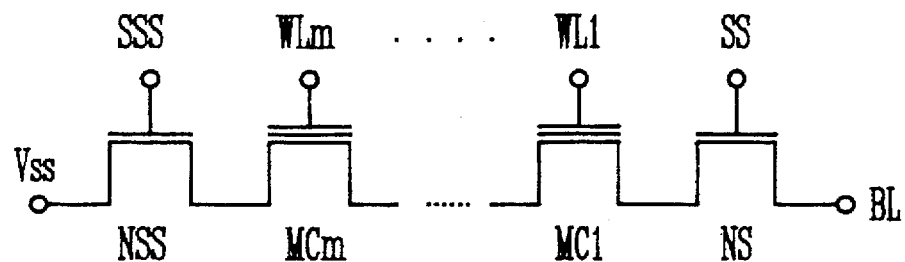
FIG. 3 is a detailed circuit diagram of a flash memory cell string shown in FIG. 2.
Figure 4:
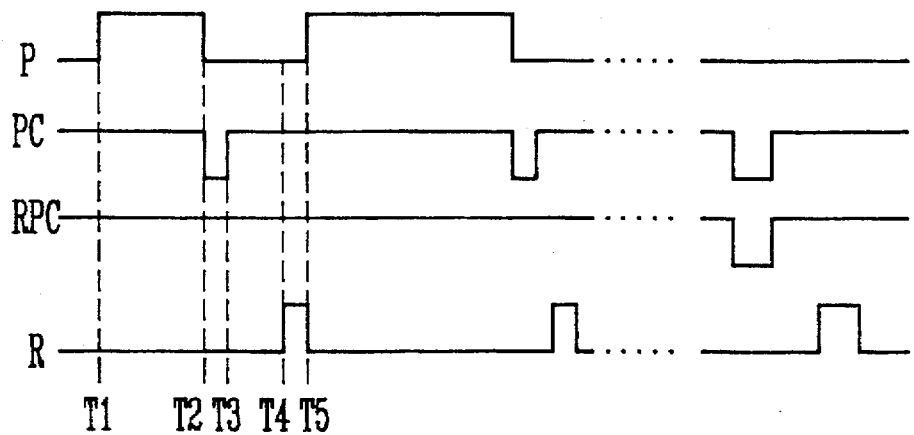
FIG. 4 is a view showing a waveform for illustrating an operation of the flash memory device shown in FIG. 2.
Figure 2:
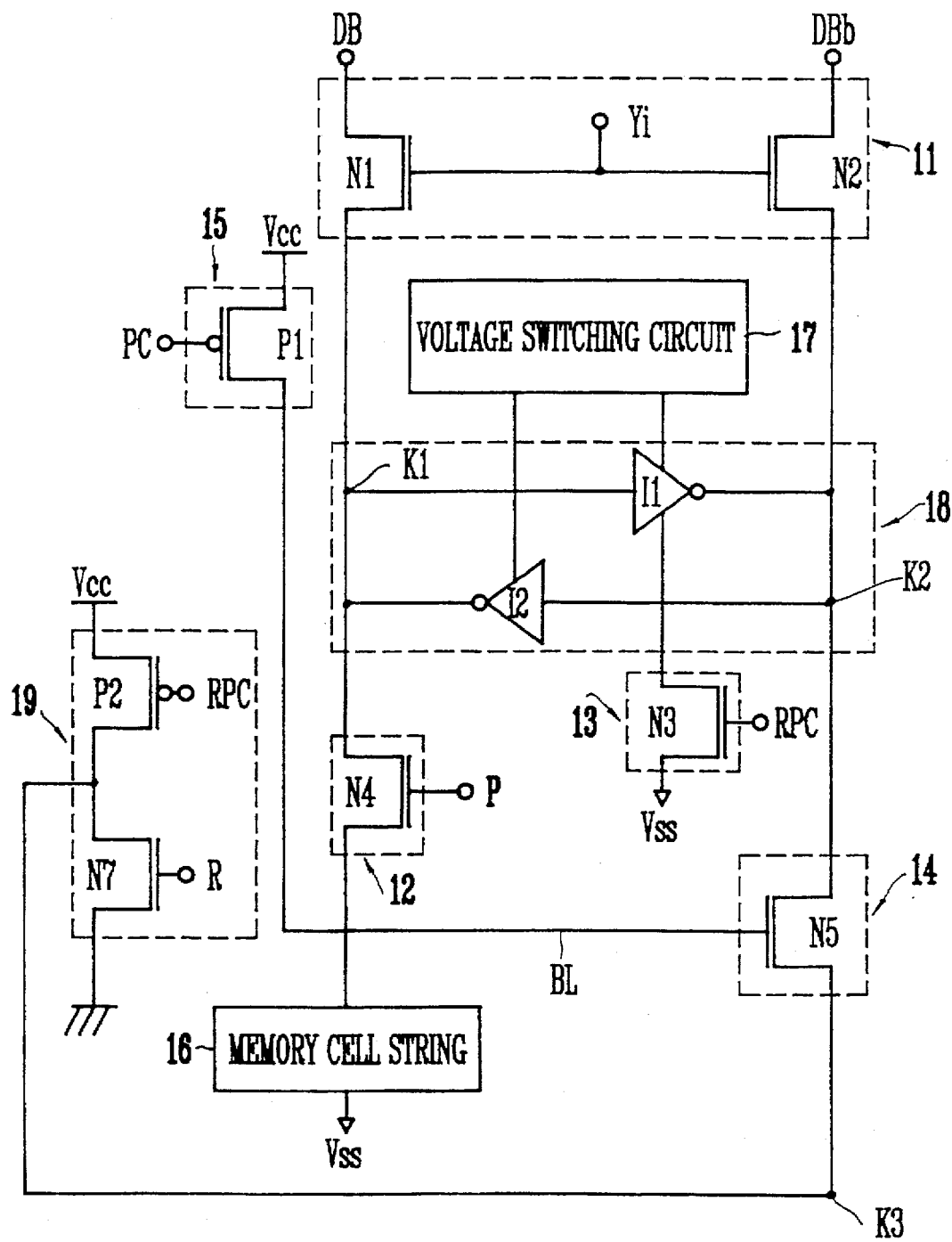
FIG. 2 is a circuit diagram of a flash memory cell according to the present invention.

FIG. 2 is a circuit diagram of a flash memory cell according to the present invention, FIG. 3 is a detailed circuit diagram of a flash memory cell string shown in FIG. 2, and FIG. 4 is a view showing a waveform for illustrating an operation of the flash memory device shown in FIG. 2.

At first, a word line-wide program operation (time 1 in FIG. 4) will be explained. A read pre-condition enable signal RPC, a precharge enable signal PC and a program enable signal P are in high state, a read enable signal R is in low state. The data in high and low states are supplied from data bus lines DB and DBb to nodes K1 and K2 through NMOS transistors N1 and N2 of a Y-decoder 11, which are turned on by an address signal Yi. Then, a NMOS transistor N4 of a first switching means 12, to which the program enable signal P is input, is turned on, and the voltage of the node K1 is supplied to a bit line BL of a memory cell string 16. The nodes K1 and K2 are latched in low and high states, respectively, and the bit line BL of the memory cell string 16 changes to low state since a current flows through the memory cell string 16. At this time, a NMOS transistor N7 and a PMOS transistor P2 of a fifth switching means 19, to which the read enable signal R and the read pre-condition enable signal RPC are input respectively, are turned off. Also, a NMOS transistor N5 of a third switching means 14, to which the bit line voltage of the memory cell string 16 is input, and a PMOS transistor P1 of a fourth switching means 15, to which the pre-charge enable signal PC is input, are turned off. A NMOS transistor N3 of a second switching means 13, to which the read pre-condition enable signal RPC is input, is turned on. Therefore, when a voltage switching circuit 17 is programmed, a drain voltage is supplied to an inverter I1 of a latch circuit 18. At this time, the node K2 is latched into a high state. The voltage level of the node K1 is latched into a low state by an inverter I2 of the latch circuit 18 to which a power supply voltage from the voltage switching circuit 17 is supplied.

Thus, the voltage level of the node K1 is latched into a low state and the voltage level of the node K2 is latched into a high state, and a word line-wide programming is performed for the memory cell string 16.

A program verification operation which is a subsequent mode of a program algorithm will be explained below.

First, the operation for precharging the bit line BL will be explained (time T2 in FIG. 4). The program enable signal P and the pre-charge enable signal PC are changed from a high state to a low state, and the read enable signal R is at low state. The read pre-condition enable signal RPC is kept at high state. At this time, as the PMOS transistor P1 of the fourth switching means 15, to which the pre-charge enable signal PC is input, is turned on, the bit line voltage in the memory cell string 16 is pre-charged into high state. The NMOS transistor Ne of the first switching means 12, to which the program enable signal P is input, is turned off. When the pre-charge enable signal PC changes to high state (time T3 of FIG. 4), the PMOS transistor P1 of the fourth switching means 15, to which the pre-charge enable signal PC is input, is turned off. At this time, the NMOS transistor N5 of the third switching means 14, to which the bit line BL voltage of the memory cell string 16 is input, is turned on, while the NMOS transistor N7 and the PMOS transistor P2 of the fifth switching means 19, to which the read enable signal R and the read pre-condition enable signal RPC are input respectively, are turned off. Therefore, the bit line BL of the memory cell string 16 is pre-charged into high state. The NMOS transistor N3 of the second switching means 13, to which the read pre-condition enable signal RPC is input, is turned on. As a result, when the voltage switching circuit 17 is programmed, the drain voltage is supplied to the inverter I1 of the latch circuit 18. At this time, the node K2 is latched into high state, also the voltage level of the node K1 is latched into a low state by the inverter I2 of the latch circuit 18, to which a power supply voltage from the voltage switching circuit 17 is supplied.

Hereinafter, the program verification operation which is a subsequent mode by a program algorithm will be explained below (time T4 in FIG. 4).

When the pre-charge operation of the bit line BL is completed, the pre-charge enable signal PC is changed from a low state into a high state, and the read enable signal R is changed from a low state into a high state. The program enable signal P is kept at low state and the read pre-condition enable signal RPC is kept at high state. At this time, if the memory cell string 16 is in a state that it is not fully programmed (that is, an erasure state), a current flows through the memory cell string 16, so that the bit line BL of the memory cell string 16 is discharged from a high state into a low state.

On the contrary, if the memory cell string 16 is in a state such that it is fully programmed, a current which flows through the memory cell string 16 is shut off, so that the bit line BL of the memory cell string 16 is pre-charged into a high state.

The state where the memory cell string 16 is not fully programmed (that is, an erasure state) will be explained below.

The NMOS transistor N7 of the fifth switching means 19, to which the read enable signal R is input, is turned on, and the PMOS transistor P2 of the fifth switching means 19, to which the read pre-condition enable signal RPC is input, is turned off. Therefore, the voltage level of a node K3 becomes a low state. However, current flows through the memory cell string 16, and the bit line BL of the memory cell string 16 is changed from a high state to a low state. As a result, the NMOS transistor N5 of the third switching means 14, to which the bit line BL of the memory cell string 16 is input, is turned off. The NMOS transistor N3 of the second switching means 13, to which the read pre-condition enable signal RPC is input, is turned on. At this time, when a read operation of the voltage switching circuit 17 is performed, the voltage level in the node K2 is latched into a high state because the drain voltage is supplied to the inverter I1 of the latch circuit 18. Also, the voltage level in the node K1 is latched into a low state through an inverter I2 to which the power supply voltage Vcc from the voltage switching circuit 17 is supplied.

Thus, if any one cell of the memory cells in the memory cell string 16 is not programmed, the program operation is performed by latching the voltage level of the nodes K1 and K2 into low and high states until the memory cell string 16 is fully programmed.

The state where the memory cell string 16 is fully programmed will be explained below.

The NMOS transistor N7 of the fifth switching means 19, to which the read-out enable signal R is input, is turned on, and the PMOS transistor P2 of the fifth switching means 19, to which the read pre-condition enable signal RPC is input, is turned off. Therefore, the voltage level of the node K3 becomes a low state. At this time, the current flowing through the memory cell string 16 is shut off, so that the bit line BL of the memory cell string 16 is pre-charged into a high state. As a result, the NMOS transistor N5 of the third switching means 14, to which the bit line BL of the memory cell string 16 is input, is turned on. Accordingly, the node K2 is inverted into a low state. The NMOS transistor N3 of the second switching means 13, to which the read pre-condition enable signal RPC is input, is turned on. At this time, when a read operation of the voltage switching circuit 17 is performed, the drain voltage is supplied to the inverter I2 on the latch circuit 18, so that the voltage level in the node K1 is latched into a high state. Also, the voltage level of the node K2 is latched into a low state through the inverter I1 to which the power supply voltage from the voltage switching circuit 17 is input.

Thus, if the memory cell string 16 is fully programmed, the voltage levels of the nodes K1 and K2 are inverted into high and low state. Therefore, when a program operation (time T5 of FIG. 4) which is a subsequent mode by means of a program algorithm is performed, the memory cell string 16 is no longer programed. The read operation which is a subsequent mode of a program algorithm will be explained below.

First, the operation for precharging the bit line BL will be explained (time T6 in FIG. 4). The program enable signal P, the pre-charge enable signal PC, the read pre-condition enable signal RPC and the read enable signal R are in a low state. The NMOS transistor N7 of the fifth switching means 19, to which the read enable signal R is input, is turned off. The PMOS transistor P2 of the fifth switching means 19, to which the read pre-condition enable signal RPC is input, is turned on. Accordingly, the node K3 is in a high state. The PMOS transistor P1 of the fourth switching means 15, to which the pre-charge enable signal PC is input, is turned on, whereby the bit line BL of the memory cell string 16 is pre-charged in a high state and the bit line BL of the memory cell string 16 is pre-charged in high state. The NMOS transistor N5 of the third switching means 14, to which the bit line BL is connected, is turned on, whereby the node K2 is in high state. Hence, the node K1 is latched in low state.

The read operation will be explained herein. The pre-charge enable signal PC and the read pre-condition enable signal RPC are charged from a low state to a high state when the operation for precharging the bit line BL is enabled (time T7 in FIG. 4). The program enable signal P is maintained at low state and the read enable signal R is changed to a high state (time T8 of FIG. 4). The PMOS transistor P2 of the fifth switching means 19 is turned on, whereby the node K3 is in a low state. Also, the PMOS transistor P1 of the fourth switching means 15 and the NMOS transistor N4 of the first switching means 12 are turned off. In addition, the NMOS transistor N3 of the second switching means 13 is turned on. At this time, the NMOS transistor N5 of the third switching means 14 is turned off, thereby maintaining a high state at the node K2. Accordingly, a drain voltage of the voltage switching circuit 17 is supplied to the inverter I2, whereby the potential of the node K1 is maintained at a high state.

Figure 5:
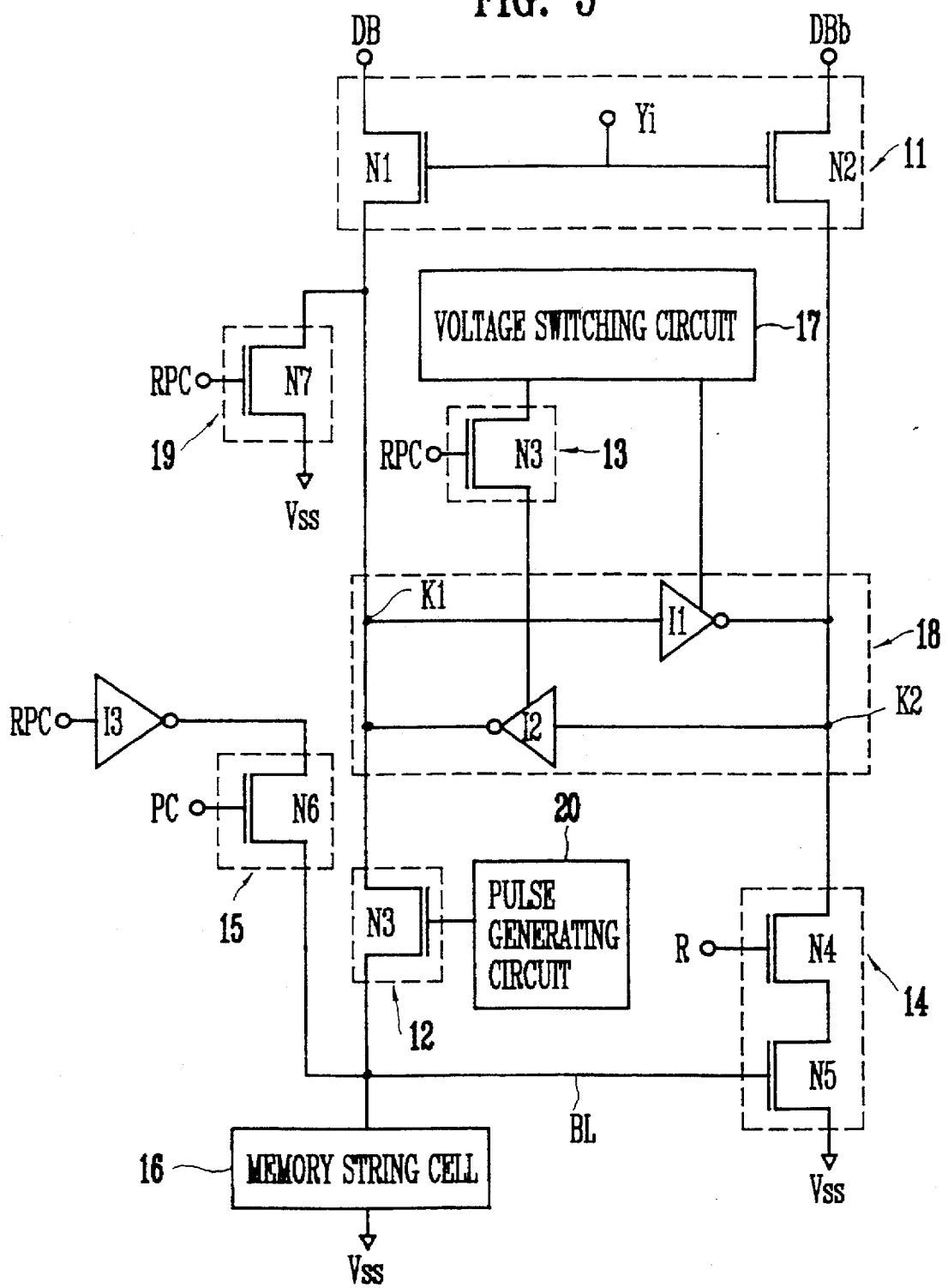
FIG. 5 is a detailed circuit diagram of another embodiment of present invention.
Figure 7:
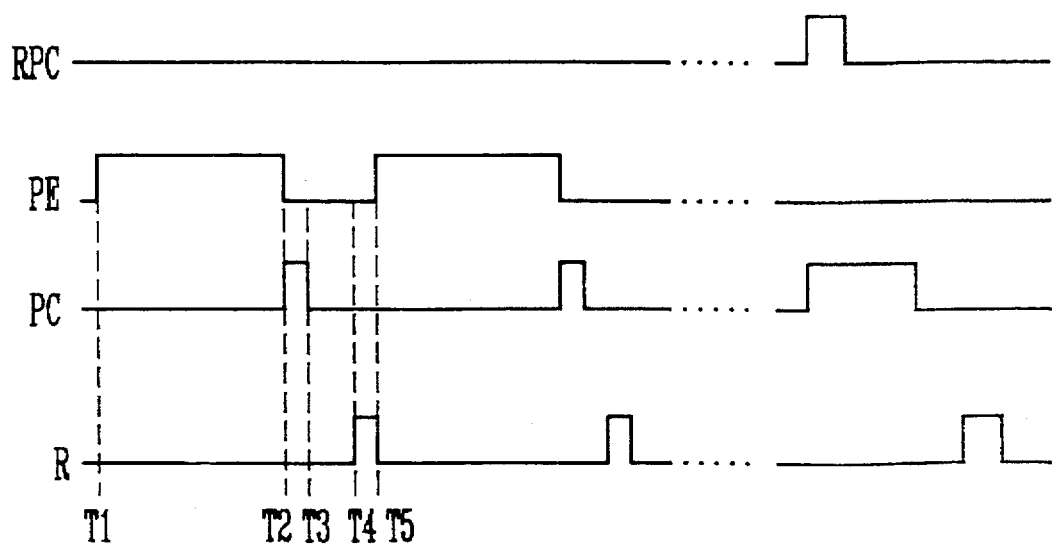
FIG. 7 is a view showing a waveform for illustrating an operation of the flash memory device shown in FIG. 5.

FIG. 5 is a detailed circuit diagram of another embodiment of present invention, and FIG. 7 is a view showing a waveform for illustrating operation of the flash memory device shown in FIG. 5.

If the flash memory device, for example, consisted of eight memory cell blocks, when performing a word line-wide program and verifying a program, at least eight circuits shown in FIG. 5 are required. For simplicity, only one circuit is shown in FIG. 5.

First, a word line wide programming operation (time T1 in FIG. 7) will be explained. A read pre-condition enable signal RPC, a precharge enable signal PC and a read-out enable signal R are at low state. A program signal PE is changed from a low state to a high state. Then, the data of low and high states are supplied respectively from data bus lines DB and DBb to nodes K1 and K2 through NMOS transistors N1 and N2 of a Y-decoder 11, which are turned on by an address signal Yi. Then, a program enable signal P which is generated from a pulse generating circuit 20 to which the program signal PE and the read pre-condition enable signal RPC are input, becomes a high state. As a NMOS transistor N3 of a first switching means 12, to which the program enable signal P is input, is turned on, the voltage of the node K1 is supplied to the bit line BL of a memory cell string 16. At this time, NMOS transistors N4 and N5 of a third switching means 14, to which the read-out enable signal R and the bit line BL voltage of the memory cell string 16 are input respectively, are turned off. Also, the read pre-condition enable signal RPC is supplied to a drain electrode of a NMOS transistor N6 of a fourth switching means 15 through an inverter I3, and the NMOS transistor N6 of the fourth switching means 15, to which the pre-charge enable signal PC is input, is turned off. A PMOS transistor P1 of a second switching means 13, to which the read pre-condition enable signal RPC is input, is turned on, while a NMOS transistor N7 of a fifth switching means 19 is turned off. At this time, when a voltage switching circuit 17 is programmed, the drain voltage is supplied to an inverter I1 of the latch circuit 18. As a result, the node K2 is latched into a high state. Also the voltage level of the node K1 is latched into a low state by the inverter I2 of the latch circuit 18 which inputs the supply voltage of the voltage switching circuit 17 as a power supply voltage.

Thus, as the voltage level of the node K1 and the voltage level of the node K2 are latched into a low state and a high state respectively, a word line-wide programming is performed on the memory cell string 16.

A program verification operation which is a subsequent mode of a program algorithm will be explained below.

First, the operation for precharging the bit line BL will be explained (time T2 to T3 in FIG. 7). The program signal PE is changed from a high state to a low state. The read enable signal R and the read pre-condition enable signal RPC are kept at low states, and the pre-charge enable signal PC is changed from a low state to a high state. At this time, the read pre-condition enable signal RPC is supplied to the drain electrode of the NMOS transistor N6 of the fourth switching means 15 through the inverter I3, and the NMOS transistor N6 of the fourth switching means 15, to which the pre-charge enable signal PC is input, is turned on, so that the bit line BL voltage of the memory cell string 16 is pre-charged at high state. Also the program enable signal P generated from the pulse generating circuit 20 to which the program signal PE and the read pre-condition enable signal RPC are input becomes a low state. Therefore, the NMOS transistor N3 of the first switching means 12, to which the program enable signal P is input, is turned off. At this time, the NMOS transistor N5 of the third switching means 14, to which the bit line BL voltage of the memory cell string 16 is input, is turned on, while the NMOS transistor N4 of the third switching means 14, to which the read enable signal R is input, is turned off. The PMOS transistor P1 of the second switching means 13, to which the read pre-condition enable signal RPC is input, is turned on. At this time, the power supply voltage from the voltage switching circuit 17 is supplied to the inverter I1 of the latch circuit 18. As a result, the node K2 is latched into a high state. Also, the voltage level of the node K1 is latched into a low state by the inverter I2 of the latch circuit 18, to which the power supply voltage from the voltage switching circuit 17 is supplied as a power supply voltage.

Hereinafter, the read operation which is a subsequent mode of a program algorithm will be explained below (time T4 in Fig. 7).

When the pre-charge operation of the bit line BL is completed, the pre-charge enable signal PC is changed from a high state to a low state (time T3 in FIG.7). The read enable signal R is changed from a low state to a high state, and the read pre-condition signal RPC and the program signal PE are kept at low state. At this time, if the memory cell string 16 is a state in which it is not fully programmed (that is, an erasure state), a current flows through the memory cell string 16, so that the bit line BL of the memory cell string 16 is charged from a high state to a low state.

If the memory cell string 16 is in a state in which it is fully programmed, a current flowing through the memory cell string 16 is shut off, so that the bit line BL of the memory cell string 16 is pre-charged into a high state.

First, the state in which the program state of the memory cell string 16 is not fully programmed (that is, an erasure state) will be explained below.

The current flows through the memory cell string 16, so that the bit line BL of the memory cell string 16 is changed from a high state to a low state. Therefore, while the NMOS transistor N4 of the third switching means 14, to which a program verification enable signal R is input, is turned on, the NMOS transistor N5 of the third switching means 14, to which the bit line BL of the memory cell string 16 is input, is turned off. The PMOS transistor P1 of the second switching means 13, to which the read pre-condition enable signal RPC is input, is turned on. At this time, the power supply of the voltage switching circuit 17 is supplied to the inverter I1 of the latch circuit 18. As a result, the node K2 is latched into a high state. Also, the voltage level of the node K1 is latched into a low state by the inverter I2 of the latch circuit 18, which receives the power supply voltage from the voltage switching circuit 17.

Thus, if any cell of the memory cells in the memory cell string 16 is not programmed, the voltage levels of the nodes K1 and K2 are latched into a low state and a high state respectively, the bit line of the memory cell string 16 is discharged, so that the programming operation is performed until the memory cell string 16 is fully programmed.

If the memory cell string 16 is fully programmed, the current flowing through the memory cell string 16 is shut off, so that the bit line BL of the memory cell string 16 is pre-charged to high state. At this time, the NMOS transistors N3 and N4 of the third switching means 14, to which the bit line BL of memory cell string 16 and the read-out enable signal R are input respectively, are turned on. Therefore, the node K2 becomes a low state. Also, the PMOS transistor P1 of the second switching means 13, to which the read precondition enable signal RPC is input, is turned off. At this time, the voltage level of the node K1 is latched into a high state by the inverter I2 to which the power supply is input from the voltage switching circuit 17. The voltage level of the node K2 is latched into a low state by the inverter I1 to which the power supply from the voltage switching circuit 17 is input.

Thus, if case the memory cell string 16 is fully programmed, the voltage levels of the nodes K1 and K2 are inverted into high and low states, so that the memory cell string 16 is no longer programmed when a programming operation which is a subsequent mode of a program algorithm(time T5 in FIG. 7) is performed.

Thereafter, the word line-wide program operation for the memory cell string is finished when the program verification enable signal R is changed from a high state to a low state (time T5 in FIG. 7).

Figure 6:
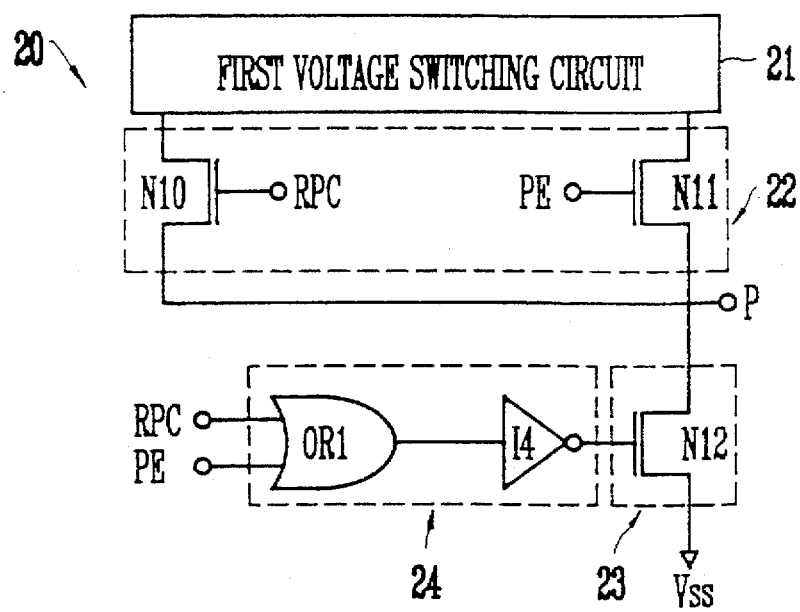
FIG. 6 is a detailed view of a pulse generating circuit of FIG. 5.

FIG. 6 is a detailed view of a pulse generating circuit of FIG. 5, operation thereof will be explained by reference to FIG. 7.

At time T1 in FIG. 7, the read pre-condition enable signal RPC is at low state, the program signal PE is changed from a low state to a high state. At this time, the read pre-condition enable signal RPC and the program signal PE are input to a first control means 24 which consists of an OR gate OR1 and an inverter I4. The OR gate OR1 to which the read pre-condition enable signal RPC and the program signal PE are input and the inverter I4 are serially connected to each other. The output from the first control means 24 becomes a low state. Therefore, a seventh switching means 23 to which an output Of the first control means 24 is input is turned off. Also, while a NMOS transistor N10 of a sixth switching means 22, to which the read pre-condition enable signal RPC is input, is turned off, a NMOS transistor N11 of the sixth switching means 22, to which the program signal PE is input, is turned on. As a result, the program enable signal P which is an output of the pulse generating circuit 20 becomes a high state.

At time T2 in FIG. 7, the read pre-condition enable signal RPC is kept at low state and the program signal PE is changed from a high state to a low state. At this time, the output of the first control means 24 to which the read pre-condition enable signal RPC and the program signal PE are input becomes a high state. Therefore, the seventh switching means 23 to which the output of the first control means 24 is input is turned off. Also, the NMOS transistor N10 of the sixth switching means 22, to which the read pre-condition enable signal RPC is input, and the NMOS transistor N11 of the sixth switching means 22, to which the program signal PE is input, are turned off. As a result, the program enable signal P which is an output of the pulse generating circuit becomes a low state.

At time T5 in FIG. 7, the read pre-condition enable signal RPC is kept at low state and the program signal PE is changed from a low state to a high state. At this time, the output of the first control means 24 to which the read pre-condition enable signal RPC and the program signal PE are input becomes a low state. Therefore, the seventh switching means 23 to which output of the first control means 24 is input is turned off. Also, while the NMOS transistor N10 of the sixth switching means 22, to which the read pre-condition enable signal RPC is input, is turned off, the NMOS transistor N11 of the sixth switching means 22, to which the program signal PE is input, is turned on. As a result, the program enable signal P which is an output of the pulse generating circuit becomes a high state.

As mentioned above, the present invention can terminate a program operation for fully programmed memory cell string by means of a program verification results when a word line-wide program operation of a NAND type flash memory cell string is performed, so that the present invention can reduce power consumption and improve the operation characteristics and reliability of the cell.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A flash memory device comprising:
    a Y-decoder for switching a supply of the data input through data bus lines in response to an address signal,
    a first switching means for supplying the data input through the Y-decoder to bit lines of a memory cell string in response to a program enable signal,
    a second switching means for switching a voltage supply from a voltage switching circuit in response to a read pre-condition enable signal,
    a fifth switching means for switching a supply of power supply voltage and a ground voltage in response to the read pre-condition enable signal and the read enable signal,
    a third switching means for switching a supply of the power supply voltage and the ground voltage passed through the fifth switching means in response to a bit line voltage of the memory cell string,
    a fourth switching means for switching a supply of the power supply voltage in response to a pre-charge enable signal, and
    a latch circuit having a first and second nodes, the latch circuit latching voltages inverted from each other to the each node in response to operations of the first, second, third, fourth and fifth switching means.

2. The flash memory device claimed in claim 1, wherein said first switching means is a NMOS transistor which is connected between the first node and the bit line of the memory cell string, and to which the program enable signal is input.

3. The flash memory device claimed in claim 1, wherein said second switching means is a NMOS transistor which is connected between the latch circuit and the ground, and to which the read pre-condition enable signal is input.

4. The flash memory device claimed in claim 1, wherein said fifth switching means is consisted of PMOS and NMOS transistors which are serially connected between the power supply terminal and the ground, and to which the read pre-condition enable signal and a read-out enable signal are input, respectively.

5. The flash memory device claimed in claim 1, wherein said third switching means is a NMOS transistor which is connected between the second node and the fifth switching means, and to which a bit line voltage of the memory cell string is input.

6. The flash memory device claimed in claim 1, wherein said fourth switching means is a PMOS transistor which is connected between the power supply terminal and the bit line of the memory cell string, and to which the pre-charge enable signal is input.

7. The flash memory device claimed in claim 1, wherein said latch circuit is consisted of a pair of inverters which are parallel connected between the first and second nodes in a reverse direction, and to which the voltage supplied from the first switching means is supplied as a power supply.

8. The flash memory device claimed in claim 1, wherein said Y-decoder is consisted of a pair of NMOS transistors, each NMOS transistor connected between each data bus line and each node and receiving the address signal.

9. A flash memory device comprising:
- a Y-decoder for switching a supply of the data input through a data bus line in response to an address signal,
- a first switching means for supplying the data input through the Y-decoder to bit lines of a memory cell string in response to a program enable signal which is an output signal of a pulse generating circuit,
- a second switching means for switching a voltage supply of a voltage switching circuit in response to a read pre-condition enable signal,
- a third switching means for switching a supply of the ground voltage in response to the bit line voltage of the memory cell string and the read-out enable signal,
- a fourth switching means for switching a supply of the read pre-condition enable signal via an inverter in response to a pre-charge enable signal,
- a fifth switching means for switching a supply of the ground voltage in response to the read pre-condition enable signal; and
- a latch circuit having a first and second nodes, the latch circuit latching voltages inverted from each other to the each node in response to operations of the first, second, third, fourth and fifth switching means.

10. The flash memory device claimed in claim 9, wherein said Y-decoder is consisted of a pair of NMOS transistors, each NMOS transistor connected between each data bus line and each node and receiving the address signal.

11. The flash memory device claimed in claim 9, wherein said first switching means is a NMOS transistor which is connected between the first node and the bit line of the memory cell string, and to which the program enable signal is input.

12. The flash memory device claimed in claim 9, wherein said second switching means is a PMOS transistor which is connected between the latch circuit and the voltage switching circuit, and to which the read pre-condition enable signal is input.

13. The flash memory device claimed in claim 9, wherein said third switching means is a pair of NMOS transistors which are serially connected between the second node and the ground, and to which the bit line voltage of the memory cell string and the read enable signals, respectively.

14. The flash memory device claimed in claim 9, wherein said fifth switching means is a PMOS transistor which is connected to the bit line of the memory cell string, the PMOS switching the read pre-condition enable signal via the inverter in response to the pre-charge enable signal.

15. The flash memory device claimed in claim 9, wherein said fifth switching means is a NMOS transistor which is connected between the first node and the ground, the NMOS transistor switching the ground voltage in response to the read pre-condition enable signal.

16. The flash memory device claimed in claim 9, wherein said latch circuit is consisted of a pair of inverters which are parallel connected between the first and second nodes in a reverse direction, and to which the voltage supplied from the first voltage switching means is supplied as a power supply.

17. The flash memory device claimed in claim 9 wherein said pulse generating circuit is consisted of;
- a sixth switching means for switching a voltage supply from a first switching circuit in response to the input of the read pre-condition enable signal and the program signal;
- a first control means to which the read pre-condition enable signal and the program signal are input;
- a seventh switching means for switching a supply of the ground voltage in response to an output signal of the first control means; and
- wherein a voltage of a high or low state is output to the output terminal in response to the sixth and seventh switching means.

18. The flash memory device claimed in claim 17, wherein said sixth switch means is a pair of NMOS transistors which are parallel connected between the first voltage circuit and the output terminal, and to which the read pre-condition enable signal and the program signal are input, respectively.

19. The flash memory device claimed in claim 17, wherein said first control means is consisted of an OR gate to which the read pre-condition enable signal and the program signal are input, and an inverter to which the output of the OR gate is input.

20. The flash memory device claimed in claim 17, wherein said seventh switching means is a NMOS transistor which is connected between the output terminal and the ground, and to which the output signal of the first control means is input.

* * * * *